US008436413B2

(12) United States Patent
Shrivatsava et al.

(10) Patent No.: US 8,436,413 B2
(45) Date of Patent: May 7, 2013

(54) NONVOLATILE FLOATING GATE ANALOG MEMORY CELL

(75) Inventors: Mayank Shrivatsava, Mumbai (IN); Maryam Shojaei Baghini, Mumbai (IN); Dinesh Kumar Sharma, Mumbai (IN); Ramgopal Rao, Mumbai (IN)

(73) Assignee: Indian Institute of Technology, Bombay, Mumbai (IN)

( * ) Notice: Subject to any disclaimer, the term of this patent is extended or adjusted under 35 U.S.C. 154(b) by 196 days.

(21) Appl. No.: 13/120,514

(22) PCT Filed: Oct. 9, 2009

(86) PCT No.: PCT/IN2009/000568
§ 371 (c)(1),
(2), (4) Date: Mar. 23, 2011

(87) PCT Pub. No.: WO2010/046922
PCT Pub. Date: Apr. 29, 2010

(65) Prior Publication Data
US 2011/0175154 A1 Jul. 21, 2011

(30) Foreign Application Priority Data
Oct. 15, 2008 (IN) .......................... 2217/MUM/2008

(51) Int. Cl.
*H01L 29/788* (2006.01)
(52) U.S. Cl.
USPC ........................ 257/316; 257/321; 257/E29.3
(58) Field of Classification Search .................. 257/313, 257/321, E29.3
See application file for complete search history.

(56) References Cited

U.S. PATENT DOCUMENTS

| 5,990,509 | A | 11/1999 | Burns, Jr. et al. |
| 2007/0012988 | A1 | 1/2007 | Bhattacharyya |
| 2007/0076482 | A1 | 4/2007 | Kato |

FOREIGN PATENT DOCUMENTS
WO    WO2008/103198    8/2008

OTHER PUBLICATIONS

International Search Report from the Australian Patent Office dated Oct. 15, 2010 for International Application No. PCT/IN2009/000568.
Written Opinion from the Australian Patent Office dated Oct. 15, 2010 for International Application No. PCT/IN2009/000568.

*Primary Examiner* — Long Pham
(74) *Attorney, Agent, or Firm* — Klein, O'Neill & Singh, LLP (57) ABSTRACT

A nonvolatile floating gate analog memory cell (1) comprising a transistor having a source (2) and drain (3) formed inside a substrate or on an insulator body (not shown) and separated by a channel (4). The memory cell comprises at least one floating gate (5) formed on one side of the source and drain. (6) is a control gate formed on one side of the floating gate and connected to a first voltage (7). (8) is a back gate formed on the other side of the source and drain and connected to a second voltage (9). The channel is separated from the floating gate and the back gate by an insulation layer (10). The control gate is separated from the floating gate by an insulation layer (11) and the source and drain are isolated from the back gate, control gate and floating gate(s) by a spacer (12). The second voltage changes the intrinsic threshold voltage linearly during programming so that the programmed threshold voltage corresponds to the second voltage.

11 Claims, 6 Drawing Sheets

NONVOLATILE FLOATING GATE ANALOG MEMORY CELL

FIELD OF THE INVENTION

This invention relates to a nonvolatile floating gate analog memory cell.

BACKGROUND OF THE INVENTION

Nonvolatile analog memory cells are widely used in analog systems like analog image processing systems or analog neural networks or on-chip analog trimming circuits for storing analog signals such as an electrical charge or value. A main advantage of using nonvolatile analog memory cells is that such cells retain the stored contents even after the power to the system has been discontinued or has failed. In analog memory cells, the analog signal may be stored on charge coupled device like capacitor(s) or on the floating gate(s) of transistor (s). An analog memory cell storing the analog signal on the floating gate normally comprises a transistor having a source and drain formed inside a substrate such as a semiconductor body or on an insulator body. The drain and source are separated by a channel normally formed inside the substrate or on the insulator body. The analog memory cell/transistor further comprises at least one floating gate normally formed on one side of the channel and a control gate formed on one side of the floating gate or located in line with the floating gate. The analog memory cell/transistor may comprise one floating gate covering the entire channel area or multiple floating gates controlling sections of the channel. The floating gate is separated from the channel and the control gate by insulation layers. The source and drain are isolated from the control gate and the floating gate(s) by a spacer. The transistor may be a p-type transistor or a n-type transistor and is manufactured by planar CMOS technology or non-planar CMOS technology like FinFet technology. When an analog signal or information signal has to be stored in an analog memory cell comprising a n-type transistor, a voltage greater than the intrinsic threshold voltage of the transistor is applied to the control gate. This voltage corresponds to the analog signal or information signal. It turns on the transistor and causes the channel between the source and the drain to be inverted. A high positive voltage is applied to the drain and the source is normally connected to the ground, the difference in the potential causes the electrons to flow from the source to the drain. During the flow of the electrons some of the electrons tunnel through the insulation layer and become trapped on the floating gate. This trapping of electrons on the floating gate is referred to as writing of the analog signal or programming of the analog memory cell or storing of charge in the memory cell. The number of electrons being trapped on the floating gate, i.e. charge being stored in the analog memory cell, depends on the intrinsic threshold voltage of the transistor of the analog memory cell. The charge being stored in the memory cell should correspond to the incoming analog signal for proper reproduction of the analog signal by the memory cell. In order that the charge stored in the memory cell is accurate, i.e. charge is corresponding to the analog signal, it is essential that the intrinsic threshold voltage of the transistor does not change after the manufacturing of the memory cell. However, the intrinsic threshold voltage of the transistor changes during manufacturing of the analog memory cell. The change in the intrinsic threshold voltage may occur due to several factors like variations in the doping of the channel, channel length or thickness of the insulator layer during the manufacturing of the memory cell. The intrinsic threshold voltage of the memory cell increases during programming due to the trapping of electrons on the floating gate and is called programmed threshold voltage. The programmed threshold voltage corresponds to the incoming analog signal and is read/sensed by the read circuit connected to the analog memory cell for reproduction of the stored analog signal. This change in the intrinsic threshold voltage leads to incorrect storage of charge in the memory cell thereby resulting in a programmed threshold voltage which does not correspond to the incoming analog signal. Therefore, the analog signal is not correctly reproduced by the analog cell. The intrinsic threshold voltage also results in reduced resolution of the memory cell. Add on units are known to be used in conjunction with analog memory cells for changing the programmed threshold voltage during programming of the memory cell. The add on units sense the programmed threshold voltage during programming and change the programmed threshold voltage so that the analog signal is correctly reproduced by the memory cell. Such units are, however, expensive besides being not very compact and occupying space. The process of sensing the programmed threshold voltage during programming of the analog memory cell also leads to increase in the programming time.

OBJECTS OF THE INVENTION

An object of the invention is to provide a nonvolatile floating gate analog memory cell, which ensures accurate storage of charge and which reproduces the analog signal correctly.

Another object of the invention is to provide a nonvolatile floating gate analog memory cell, which has high resolution.

Another object of the invention is to provide a nonvolatile floating gate analog memory cell, which has good linearity as a result of which any change in the analog signal results in a linearly proportional change in the charge stored on the floating gate.

Another object of the invention is to provide a nonvolatile floating gate analog memory cell, which is robust and whose performance is independent of the variations in the intrinsic threshold voltage.

Another object of the invention is to provide a nonvolatile floating gate analog memory cell, which reduces programming time.

Another object of the invention is to provide a nonvolatile floating gate analog memory cell, which is compact and economical.

DETAILED DESCRIPTION OF THE INVENTION

The following is a detailed description of the invention with reference to the accompanying drawings, in which.

Figure 1:
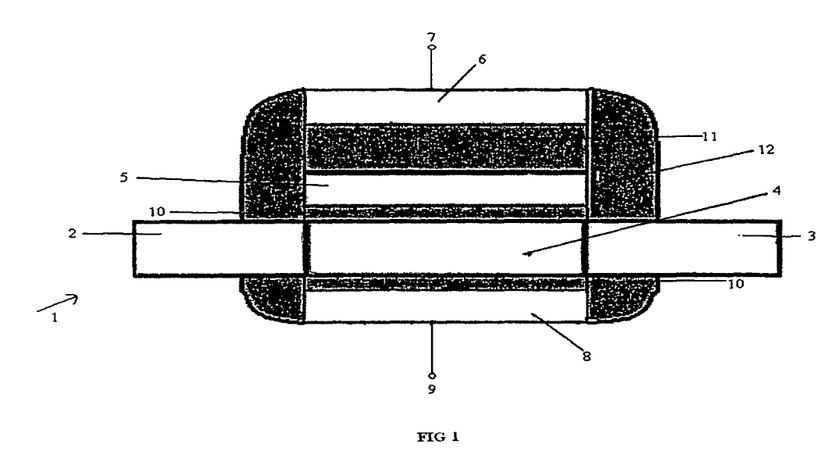
FIG. 1 is a cross sectional view of an analog memory cell according to an embodiment of the invention.

The nonvolatile floating gate analog memory cell (1) as illustrated in FIG. 1 of the accompanying drawings comprises a transistor having a source (2) and drain (3) formed on an insulator body (not shown). The source and drain are separated by a channel (4). (5) is a floating gate formed on one side of the source and drain. (6) is a control gate formed on one side of the floating gate and connected to a voltage (7). (8) is a back gate formed on the other side of the source and drain and connected to a voltage (9). The channel is separated from the floating gate and the back gate by an insulation layer (10).

Figure 2:
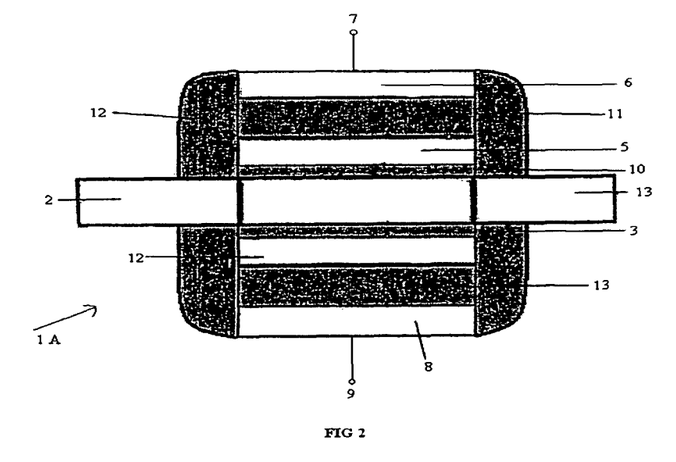
FIG. 2 is a cross sectional view of an analog memory cell according to another embodiment of the invention.

The control gate is separated from the floating gate by an insulation layer (11). The source and drain are insolated from the control gate, back gate and floating gate by a spacer (12). The memory cell (1A) as illustrated in FIG. 2 of the accompanying drawings comprises a floating gate (12) formed on the other side of the source and the drain. The floating gate (12) is separated from the channel and the back gate by insulation layers marked (13). The voltage (7) is greater than the intrinsic threshold voltage of the transistor. The voltage (7) turns on the transistor and causes the channel between the source and the drain to be inverted. The voltage (9) is the analog signal or information signal. During the programming of the analog memory the voltage at the back gate changes the programmed threshold voltage so that the charge stored in the analog cell corresponds to the analog signal.

The following example is illustrative of the invention but not limitative of the scope thereof.

EXAMPLE 1

Figure 3:
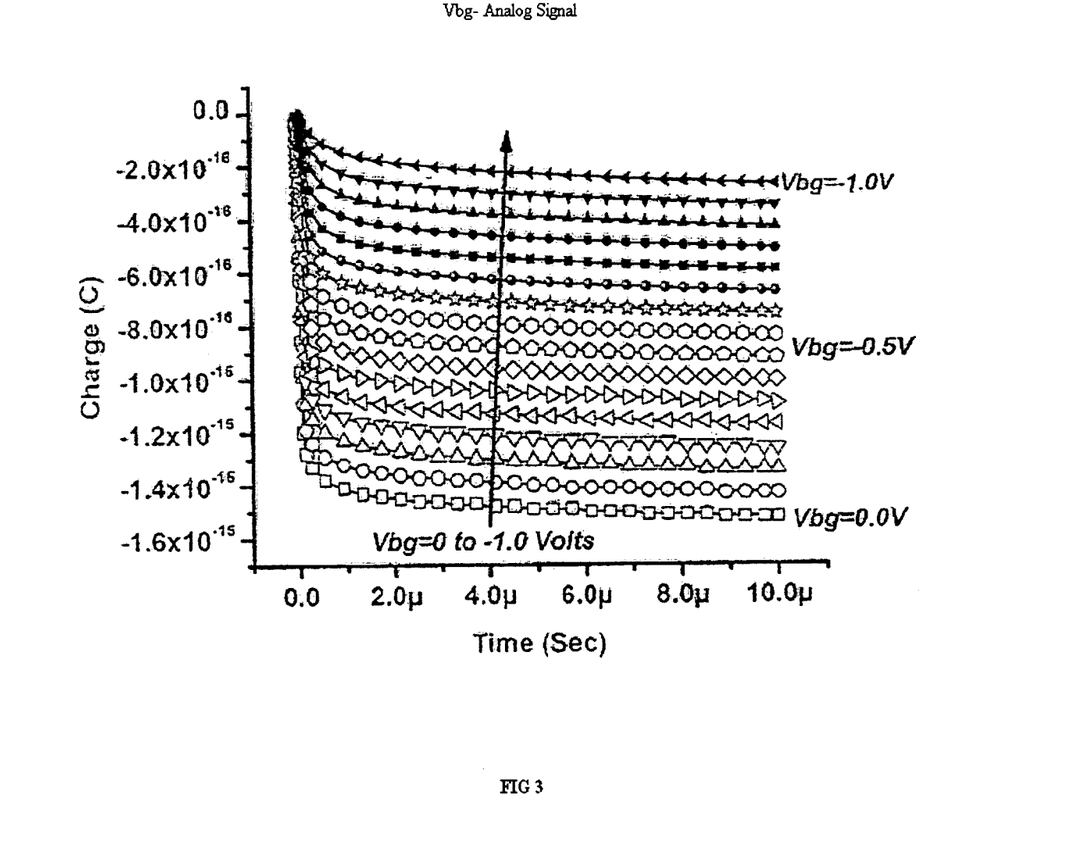
FIGS. 3, 4, 5, 6, 7, 8 and 9 are graphs illustrating the performance characteristics of a typical analog memory cell of FIG. 1 during the programming thereof.
Figure 4:
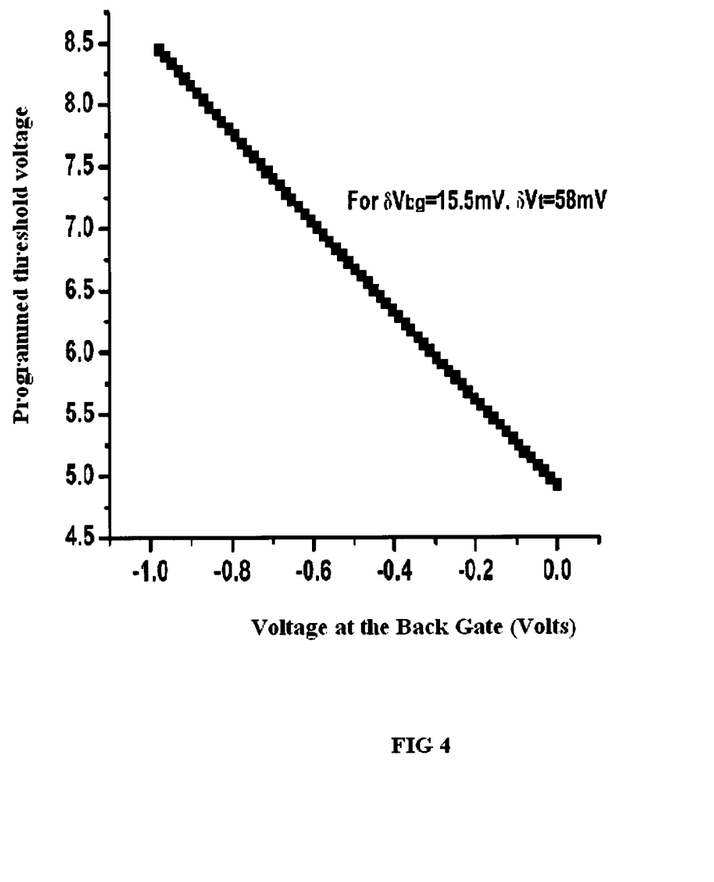
Figure 5:
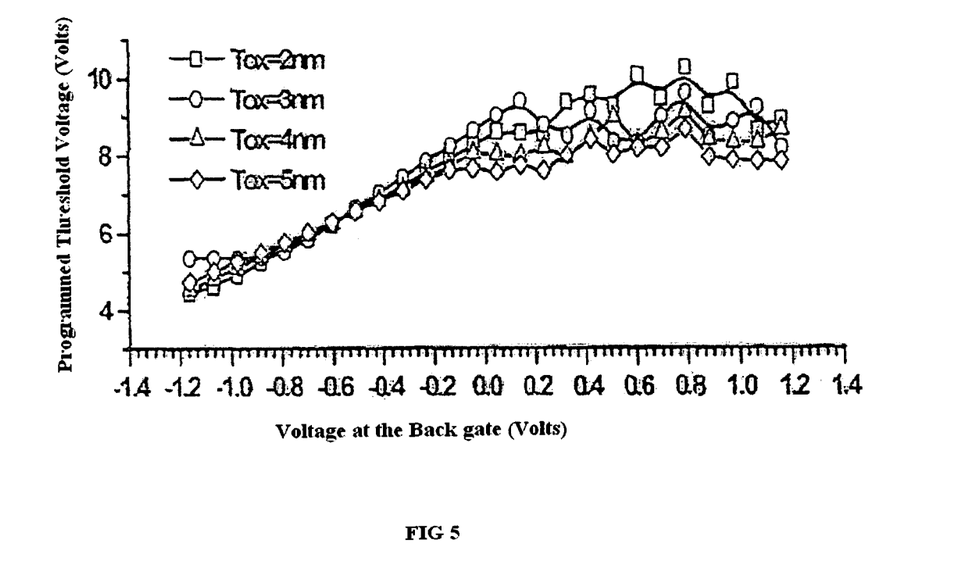
Figure 6:
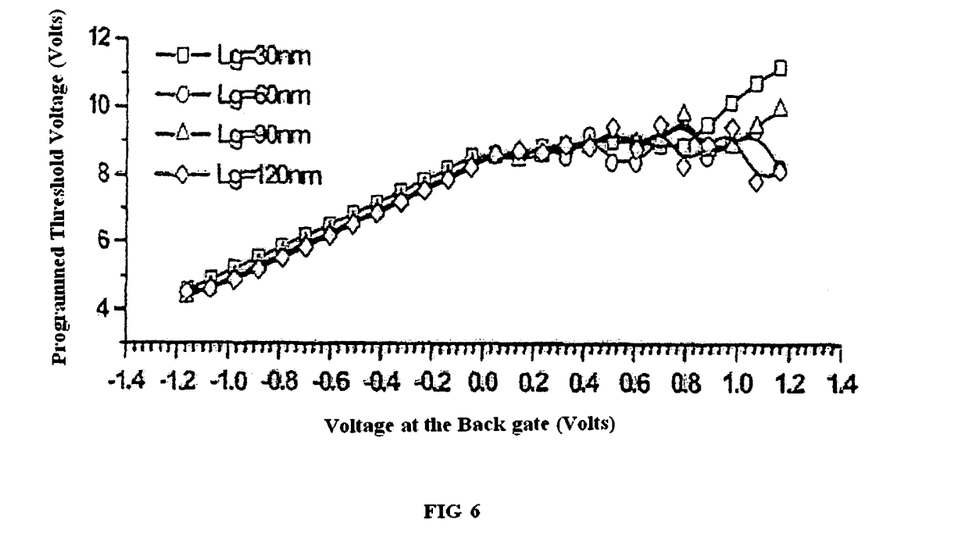
Figure 7:
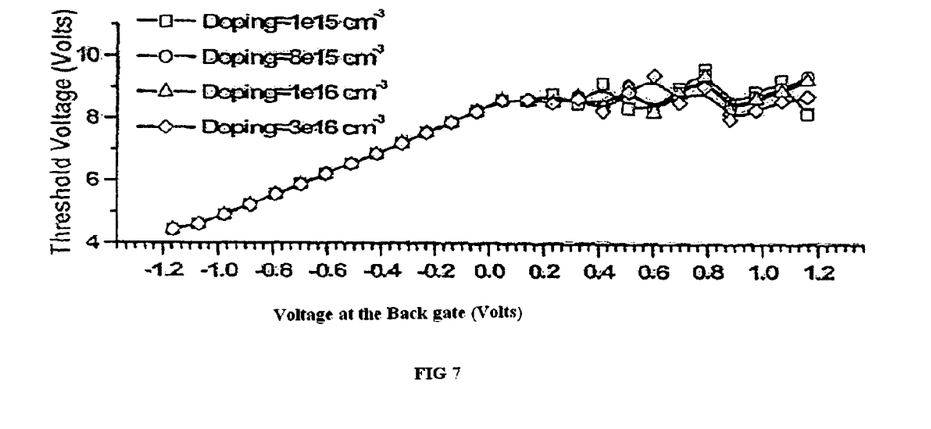
Figure 8:
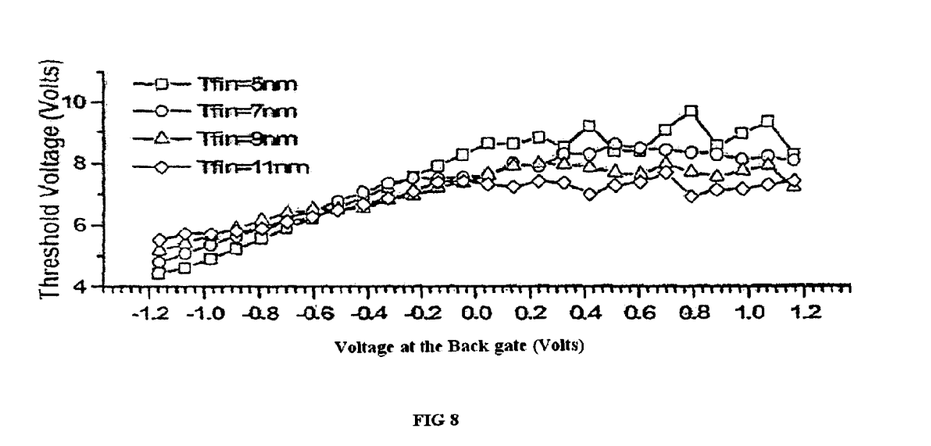
Figure 9:
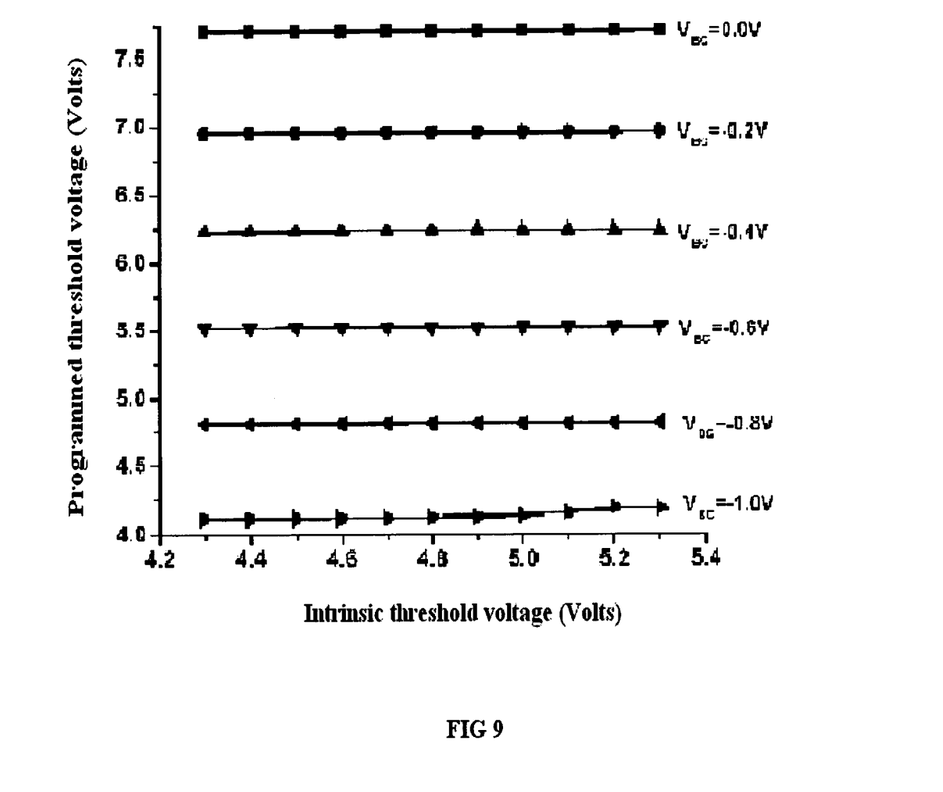

A typical analog memory cell of FIG. 1 was realized in FinFet technology using Santaurus structure editor and had the following specifications:
Material of floating gate: polysilicon;
Thickness of floating gate: 15 nm;
Length of channel: 30 nm;
Thickness of back gate and control gate: 3 nm;
Material of back gate and control gate: polysilicon;
Strength of information signal: 0 to −1.0V in steps of 15 mv to store 64 levels of charge;
Control gate voltage: 6V;
Drain voltage during programming: 3.5V;
Source voltage: 0V;
Intrinsic threshold voltage: 4.8V;

The memory cell was subjected to simulation using S device from Synopsis. The analog memory cell was programmed i.e. information signal of varying strengths in the range of 0 to −1.0V was applied to the back gate to store 64 levels of charge. The programmed threshold voltage for each change in the information signal was sensed. The results were graphically represented in FIGS. 3 to 9 of the drawings. It is seen from FIG. 3 that the charge being stored in the analog memory cell corresponds to the voltage at the back gate i.e. the analog signal. It is seen from FIG. 4 that the memory cell is linear. Changes in the voltage at the back gate (analog signal) lead to a linearly proportional change in the charge stored (programmed threshold voltage). The intrinsic threshold voltage of the memory cell was changed by varying the thickness of the back gate; length of the channel; doping of the channel and thickness of the source as follows:
  a. thickness of the back gate was varied as 2 nm, 3 nm, 4 nm and 5 nm
  b. length of the channel was varied as 30 nm, 60 nm, 90 nm and 120 nm
  c. doping of the channel was varied as 1e15 cm$^{-3}$, 8e15 cm$^{-3}$, 1e16 cm$^{-3}$ and 3e16 cm$^{-3}$
  d. thickness of the source was varied as 5 nm, 7 nm, 9 nm and 11 nm Further the intrinsic threshold voltage was changed from 4.3V to 5.3V in steps of 0.1V by simulation.

It is seen from the graphs in FIGS. 5, 6, 7, 8 and 9 that irrespective of the variations in the intrinsic threshold voltage, the programmed threshold voltage remained the same. This is because the voltage at the back gate changes the programmed threshold voltage during programming of the analog memory cell so that the charge stored in the memory cell corresponds to the analog signal.

It is evident from the above examples that the memory cell of the invention accurately reproduces the analog signal and is linear. Any change in the analog signal results in a linearly proportional change in the charge stored in the memory cell. The memory cell is also robust as it is independent of the variations in the threshold voltage. As the programmed threshold voltage is changed by the voltage at the back gate add on units are eliminated. This results in reduced programming time. The memory cell is also compact and economical. The memory cell of the invention may be used for single bit or multi bit or multi level storage in analog systems. The memory cell of the invention may also be used in digital systems for multi bit storage.

It is possible to have variations in the invention without deviating from the scope thereof. For instance the transistor can be manufactured by planar CMOS technology or non-planar CMOS technology or any other known technology. The materials of the gates namely control gate, back gate and floating gate(s) and the materials of the spacer and insulation layer and insulator body may be different from those mentioned in the specification. Such variations of the invention are to be construed and understood to be obvious to those skilled in the art and within the scope of the invention.

The invention claimed is:

1. A nonvolatile floating gate analog memory cell comprising a transistor having a source and drain formed inside a substrate or on an insulator body and separated by a channel, a first floating gate formed on one side of the source and drain and a second floating gate formed on the other side of the source and drain, a control gate formed on one side of the first floating gate and connected to a first voltage, a back gate formed on the other side of the source and drain and connected to a second voltage, the channel being separated from the floating gates and the back gate by an insulation layer, the control gate being separated from the floating gates by an insulation layer and the source and drain being isolated from the back gate, control gate and floating gates by a spacer, the second voltage changing the intrinsic threshold voltage linearly during programming so that the programmed threshold voltage corresponds to the second voltage.

2. The nonvolatile memory cell as claimed in claim 1, wherein the first voltage is greater than an intrinsic threshold voltage of the transistor.

3. The nonvolatile memory cell as claimed in either one of claims 1 or 2, wherein the second voltage is an analog signal or information signal.

4. The nonvolatile memory cell as claimed in any one of claims 1 or 2, wherein the second voltage is connected to the back gate directly or through an intermediate circuit.

5. The nonvolatile memory cell as claimed in any one of claims 1 or 2, wherein the substrate is formed of p-type silicon.

6. The nonvolatile memory cell as claimed in any one of claims 1 or 2, wherein the insulator body is formed of silicon dioxide.

7. The nonvolatile memory cell as claimed in any one of claims 1 or 2, wherein the back gate and control gate are formed of materials selected from electric conductors and semiconductors.

8. The nonvolatile memory cell as claimed in any one of claims 1 or 2, wherein the insulation layer and spacer are formed of materials selected from silicon dioxide and silicon nitride.

9. The nonvolatile floating gate analog memory cell as claimed in any one of claims 1 or 2, wherein the floating gates are formed of materials selected from electric conductors and semiconductors.

10. The nonvolatile floating gate analog memory cell as claimed in any one of claims 1 or 2, wherein the transistor comprises a MOSFET transistor.

11. The nonvolatile analog memory cell as claimed in any one of claims 1 or 2, wherein the transistor is manufactured by planar CMOS technology or non-planar CMOS technology.

\* \* \* \* \*

UNITED STATES PATENT AND TRADEMARK OFFICE
CERTIFICATE OF CORRECTION

PATENT NO. : 8,436,413 B2  
APPLICATION NO. : 13/120514  
DATED : May 7, 2013  
INVENTOR(S) : Shrivastava et al.

Page 1 of 1

It is certified that error appears in the above-identified patent and that said Letters Patent is hereby corrected as shown below:

On the Title Page (Item 12 and 75), under "Inventors", delete "Shrivatsava" and insert
-- Shrivastava --, therefor.

Signed and Sealed this
Second Day of July, 2013

Teresa Stanek Rea
*Acting Director of the United States Patent and Trademark Office*